United States Patent
Champlin

(10) Patent No.: US 6,294,897 B1
(45) Date of Patent: Sep. 25, 2001

(54) METHOD AND APPARATUS FOR ELECTRONICALLY EVALUATING THE INTERNAL TEMPERATURE OF AN ELECTROCHEMICAL CELL OR BATTERY

(76) Inventor: Keith S. Champlin, 5437 Elliot Ave., South, Minneapolis, MN (US) 55417

(*) Notice: Subject to any disclaimer, the term of this patent is extended or adjusted under 35 U.S.C. 154(b) by 0 days.

(21) Appl. No.: 09/691,586

(22) Filed: Oct. 18, 2000

Related U.S. Application Data

(62) Division of application No. 09/388,276, filed on Sep. 1, 1999, now Pat. No. 6,137,269.

(51) Int. Cl.$^7$ ............... G01N 27/416; H02J 7/00
(52) U.S. Cl. ............................ 320/153; 324/431
(58) Field of Search ..................... 320/153; 324/431

(56) References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,562,634 | 2/1971 | Latner | 31/4 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |
| 3,811,089 | 5/1974 | Strezelewicz | 324/170 |
| 3,873,911 | 3/1975 | Champlin | 324/29.5 |
| 3,876,931 | 4/1975 | Godshalk | 324/29.5 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/65 |
| 4,008,619 | 2/1977 | Alcaide et al. | 73/398 |

(List continued on next page.)

FOREIGN PATENT DOCUMENTS

| | | |
|---|---|---|
| 0 022 450 A1 | 1/1981 | (EP) . |
| 29 26 716 B1 | 1/1981 | (DE) . |
| 0 637 754 A1 | 2/1995 | (EP) . |

(List continued on next page.)

OTHER PUBLICATIONS

"Electrochemical Impedance Spectroscopy in Battery Development and Testing", *Batteries International*, Apr. 1997, pp. 59 and 62–63.

(List continued on next page.)

*Primary Examiner*—Peter S. Wong
*Assistant Examiner*—Gregory J. Toatley, Jr.
(74) *Attorney, Agent, or Firm*—Westman, Champlin & Kelly, P.A.

(57) ABSTRACT

A testing device applies time-varying electrical excitation to a cell or battery and senses the resulting time-varying electrical response. Computation circuitry within the device uses voltage and current signals derived from the excitation and response signals as inputs and computes values of elements of an equivalent circuit representation of the cell or battery. The internal temperature of the cell or battery is calculated from the value of the time constant of a particular parallel G-C subcircuit of the equivalent circuit. The battery's internal temperature is then either displayed to the user, used to apply appropriate temperature corrections to other computed quantities, used to detect thermal runaway, and/or used to control an external process such as charging of the battery.

37 Claims, 2 Drawing Sheets

U.S. PATENT DOCUMENTS

| | | | |
|---|---|---|---|
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,217,645 | 8/1980 | Barry et al. | 364/483 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,633,418 | 12/1986 | Bishop | 364/554 |
| 4,659,977 | 4/1987 | Kissel et al. | 320/64 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,786 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,913,116 | 4/1990 | Katogi et al. | 123/425 |
| 4,929,931 | 5/1990 | McCuen | 340/636 |
| 4,931,738 | 6/1990 | MacIntyre et al. | 324/435 |
| 4,937,528 | 6/1990 | Palanisamy | 324/430 |
| 4,947,124 | 8/1990 | Hauser | 324/430 |
| 4,956,597 | 9/1990 | Heafey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 | 9/1992 | Bosscha | 320/44 |
| 5,144,248 | 9/1992 | Alexandres et al. | 324/428 |
| 5,160,881 | 11/1992 | Schramm et al. | 322/7 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,321,626 | 6/1994 | Palladino | 364/483 |
| 5,331,268 | 7/1994 | Patino et al. | 320/20 |
| 5,336,993 | 8/1994 | Thomas et al. | 324/158.1 |
| 5,338,515 | 8/1994 | Betta et al. | 422/95 |
| 5,339,018 | 8/1994 | Brokaw | 320/35 |
| 5,343,380 | 8/1994 | Champlin | 363/46 |
| 5,347,163 | 9/1994 | Yoshimura | 307/66 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,412,323 | 5/1995 | Kato et al. | 324/429 |
| 5,426,371 | 6/1995 | Salley et al. | 324/429 |
| 5,426,416 | 6/1995 | Jefferies et al. | 340/664 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,451,881 | 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,537,967 | 7/1996 | Tashiro et al. | 123/792.1 |
| 5,546,317 | 8/1996 | Andrieu | 364/481 |
| 5,548,273 | 8/1996 | Nicol et al. | 340/439 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,656,920 | 8/1997 | Cherng et al. | 320/31 |
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,705,929 | 1/1998 | Caravello et al. | 324/430 |
| 5,710,503 | 1/1998 | Sideris et al. | 320/6 |
| 5,717,336 | 2/1998 | Basell et al. | 324/430 |
| 5,717,937 | 2/1998 | Fritz | 395/750.01 |
| 5,747,909 | 5/1998 | Syverson et al. | 310/156 |
| 5,757,192 | 5/1998 | McShane et al. | 324/427 |
| 5,760,587 | 6/1998 | Harvey | 324/434 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,808,469 | 9/1998 | Kopera | 324/43.4 |
| 5,821,756 | 10/1998 | McShane et al. | 324/430 |

| | | | |
|---|---|---|---|
| 5,825,174 | 10/1998 | Parker | 324/106 |
| 5,831,435 | 11/1998 | Troy | 324/426 |
| 5,862,515 | 1/1999 | Kobayashi et al. | 702/63 |
| 5,872,443 | 2/1999 | Williamson | 320/21 |
| 5,895,440 | 4/1999 | Proctor et al. | 702/63 |
| 5,914,605 | 6/1999 | Bertness | 324/430 |
| 5,929,609 | 7/1999 | Joy et al. | 322/25 |
| 5,939,855 | 8/1999 | Proctor et al. | 320/104 |
| 5,939,861 | 8/1999 | Joko et al. . | |
| 5,945,829 | 8/1999 | Bertness | 324/430 |
| 5,969,625 | 10/1999 | Russo | 340/636 |
| 6,002,238 | 12/1999 | Champlin | 320/134 |
| 6,008,652 | 12/1999 | Theofanopoulos et al. | 324/434 |
| 6,009,369 | 12/1999 | Boisvert et al. | 701/99 |
| 6,031,354 | 2/2000 | Wiley et al. | 320/116 |
| 6,037,751 | 3/2000 | Klang | 320/160 |
| 6,037,777 | 3/2000 | Champlin | 324/430 |
| 6,051,976 | 4/2000 | Bertness | 324/426 |
| 6,072,299 | 6/2000 | Kurie et al. | 320/112 |
| 6,072,300 | 6/2000 | Tsuji | 320/116 |
| 6,081,098 | 6/2000 | Bertness et al. | 320/134 |
| 6,091,245 | 7/2000 | Bertness | 324/426 |
| 6,094,033 | 7/2000 | Ding et al. | 320/132 |
| 6,104,167 | 8/2000 | Bertness et al. | 320/132 |
| 6,114,834 | 9/2000 | Parise | 320/109 |
| 6,137,269 | 10/2000 | Champlin | 320/150 |
| 6,150,793 | 11/2000 | Lesesky et al. | 320/104 |
| 6,163,156 | 12/2000 | Bertness | 324/426 |
| 6,172,483 | 1/2001 | Champlin | 320/134 |
| 6,172,505 | 1/2001 | Bertness | 324/430 |

FOREIGN PATENT DOCUMENTS

| | | |
|---|---|---|
| 0 772 056 A1 | 5/1997 | (EP) . |
| 2 749 397 | 12/1997 | (FR) . |
| 2 088 159 A | 6/1982 | (GB) . |
| 59-17892 | 1/1984 | (JP) . |
| 59-17893 | 1/1984 | (JP) . |
| 59-17894 | 1/1984 | (JP) . |
| 59017894 | 1/1984 | (JP) . |
| 59215674 | 12/1984 | (JP) . |
| 60225078 | 11/1985 | (JP) . |
| 62-180284 | 8/1987 | (JP) . |
| 63-027776 | 5/1988 | (JP) . |
| 03274479 | 12/1991 | (JP) . |
| 03282276 | 12/1991 | (JP) . |
| 4-8636 | 1/1992 | (JP) . |
| 04131779 | 5/1992 | (JP) . |
| 04372536 | 12/1992 | (JP) . |
| 5216550 | 8/1993 | (JP) . |
| 7-128414 | 5/1995 | (JP) . |
| WO 93/22666 | 11/1993 | (WO) . |
| WO 98/58270 | 12/1998 | (WO) . |

OTHER PUBLICATIONS

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standarads Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

U.S. application No. 09/388,501, Champlin, filed Sep. 1, 1999.

U.S. application No. 09/503015, Champlin, filed Feb. 11, 2000.

U.S. application No. 09/710,031, Champlin, filed Nov. 10, 2000.

METHOD AND APPARATUS FOR ELECTRONICALLY EVALUATING THE INTERNAL TEMPERATURE OF AN ELECTROCHEMICAL CELL OR BATTERY

This is a Divisional application of U.S. patent application Ser. No. 09/388,276, filed Sep. 1, 1999 now U.S. Pat. No. 6,137,269.

BACKGROUND OF THE INVENTION

The present invention relates to testing of storage batteries. More specifically, the invention relates to measuring temperature of an electrochemical cell or battery.

When testing or evaluating the performance of cells and batteries, it is desirable to accurately know battery temperature in order to apply appropriate temperature corrections to the measured results. For example Champlin, in U.S. Pat. No. 3,909,708, describes setting a dial on the tester to the battery's temperature in order to cause the measured dynamic conductance to comport with that of a battery at room temperature. However, exactly how this battery temperature information is to be obtained is not discussed. Others employ a very rough correction by instructing the user to push a button when the ambient temperature is, e.g., "below 0° C.". Marino et al., in U.S. Pat. No. 4,423,378 refer to a battery temperature "probe" whose output is inputted to a microprocessor for the purpose of correcting load-test results. Similar temperature probes are described by Alber et al. in U.S. Pat. No. 4,707,795. Other workers have attached thermistors to test clips so that they would be in thermal contact with a battery terminal, or have placed them in thermal contact with the battery's case. Even infrared techniques have been used to determine battery case temperature.

All of these prior art techniques have measured either the battery's ambient temperature or its external case temperature. Unfortunately however, these quantities can be very different from the actual internal temperature of the battery—the truly desired quantity. These temperature differences come about from localized internal heating caused by currents flowing through the battery, from the large thermal mass of the battery, and from the poor thermal contact between the battery and its environment. For example, an automobile engine compartment will warm up rapidly with the engine running. If the battery is cold, however, its internal temperature will remain low for a very long period of time.

SUMMARY OF THE INVENTION

A testing device applies time-varying electrical excitation to a cell or battery and senses the resulting time-varying electrical response. Computation circuitry within the device uses voltage and current signals derived from the excitation and response signals as inputs and computes values of elements of an equivalent circuit representation of the cell or battery. The internal temperature of the cell or battery is calculated from the value of the time constant of a particular parallel G-C subcircuit of the equivalent circuit. In various aspects, the battery's internal temperature is then displayed to the user, used to apply appropriate temperature corrections to other computed quantities, used to detect thermal runaway, and/or used to control an external process such as charging of the battery.

DETAILED DESCRIPTION OF THE PREFERRED EMBODIMENTS

Clearly, a method and apparatus for electronically determining the true internal temperature of a cell/battery would be of great value. The present invention addresses this need.

A very important application of the method taught herein is in the detection of "thermal runaway"—a phenomenon in which the internal temperature of a battery undergoing charging rises catastrophically (see, e.g., McShane et al., U.S. Pat. No. 5,574,355). Using the technique disclosed below, a runaway condition can be quickly detected by a precipitous internal temperature rise, which, in turn could be used to shut off the charger or reduce its charging voltage.

Figure 1:
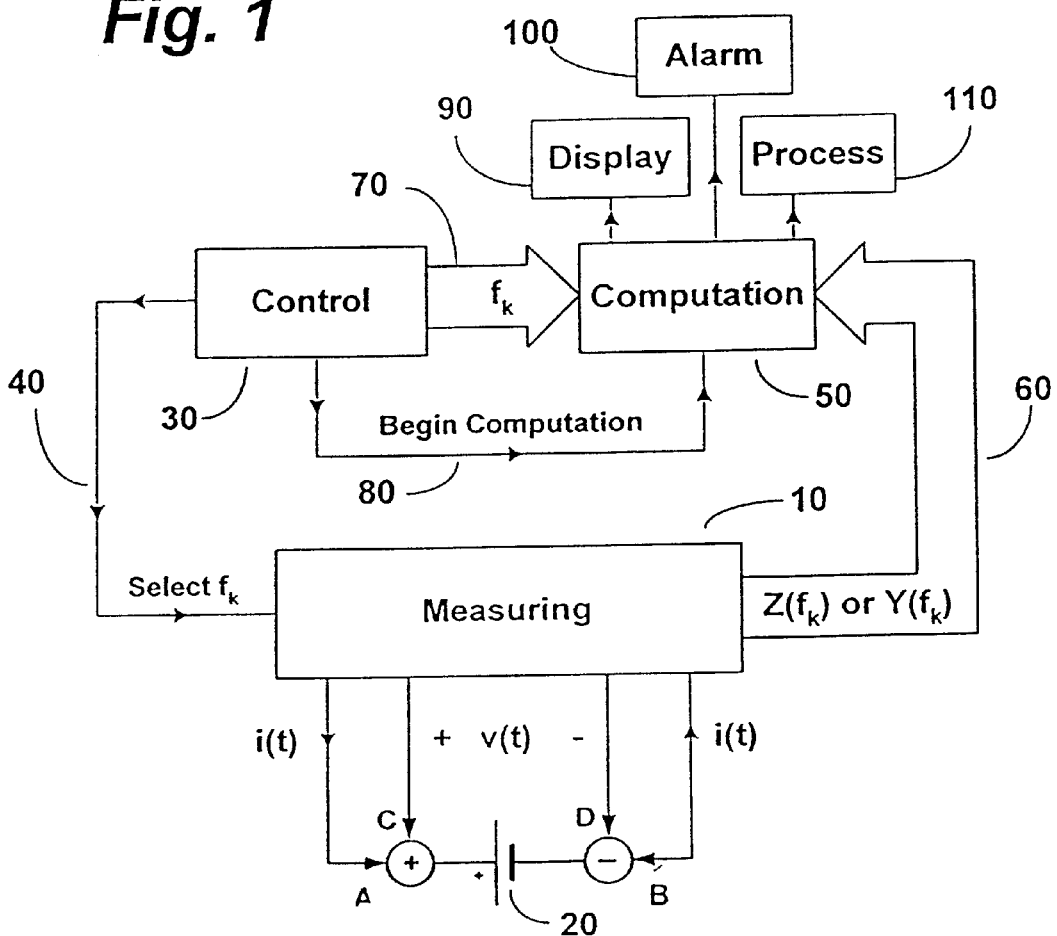
FIG. 1 is a block diagram of a device for measuring the internal temperature of an electrochemical cell or battery according to the present invention.

FIG. 1 discloses a block diagram of apparatus for evaluating a battery's internal temperature according to the present invention. Apparatus of this type is fully disclosed in pending U.S. patent application Ser. No. 09/152,219, filed Sep. 11, 1998 and entitled "METHOD AND APPARATUS FOR MEASURING COMPLEX IMPEDANCE OF CELLS AND BATTERIES" and pending U.S. patent application Ser. No. 09/151,324, filed Sep. 11, 1998, entitled "METHOD AND APPARATUS FOR DETERMINING BATTERY PROPERTIES FROM COMPLEX IMPEDANCE ADMITTANCE" which are incorporated herein by reference. Measuring circuitry 10 electrically couples to cell/battery 20 by means of current-carrying contacts A and B and voltage-sensing contacts C and D. Measuring circuitry 10 passes a periodic time-varying current i(t) through contacts A and B and senses a periodic time-varying voltage v(t) across contacts C and D. By appropriately processing and combining i(t) and v(t), measuring circuitry 10 determines real and imaginary parts of a complex parameter, either impedance Z or admittance Y, at a measuring frequency $f_k$; where $f_k$ is a discrete frequency contained in the periodic waveforms of both i(t) and v(t).

Control circuitry 30 couples to measuring circuitry 10 via command path 40 and commands measuring circuitry 10 to determine the complex parameter of cell/battery 20 at, each one of n discrete measuring frequencies, where n is an integer number. This action defines 3n experimental quantities: the values of the n measuring frequencies and the values of the n imaginary parts and n real parts of the complex parameter at the n measuring frequencies.

Computation circuitry 50 couples to measuring circuitry 10 and to control circuitry 30 via data paths 60 and 70, respectively, and accepts the 2n experimental values from measuring circuitry 10 and the values of the n measuring frequencies from control circuitry 30. Upon a "Begin Computation" command from control circuitry 30 via command path 80, computation circuitry 50 uses algorithms disclosed in U.S. patent application Ser. No. 09/151,324 to combine these 3n quantities numerically to evaluate 2n elements of an equivalent circuit representation of the cell/battery. Computation circuitry 50 then calculates the internal temperature of the cell/battery from values of particular elements of this circuit representation. Finally, computation circuitry 50 outputs the computed result to the user on display 90 and/or uses the result to activate an alarm 100 or to control a process 110 such as a battery charger.

In practice, a microprocessor or microcontroller running an appropriate software program can perform the functions of both control circuitry 30 and computation circuitry 50.

Figure 2:
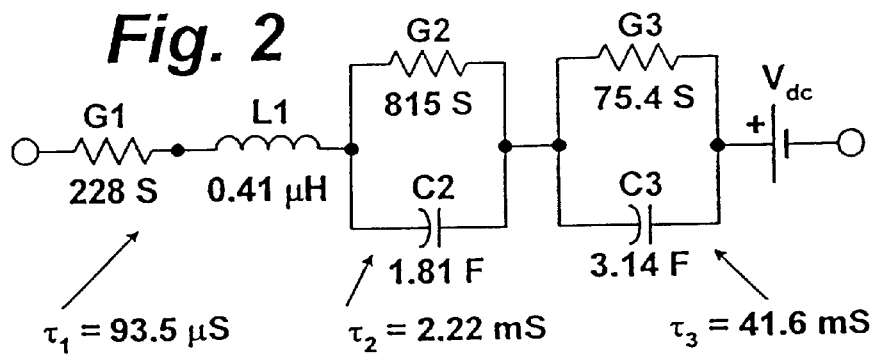
FIG. 2 depicts a six-element small signal equivalent circuit representation of a particular automotive storage battery.

FIG. 2 discloses a six-element equivalent circuit representation of a typical automotive storage battery. This circuit representation was evaluated using apparatus of the type disclosed in FIG. 1 with n=3 by employing algorithms disclosed in U.S. patent application Ser. No. 09/151,324. The three measurement frequencies were 5 Hz, 70 Hz, and 1000 Hz. One notes that the n=3 equivalent circuit comprises three subcircuits:

A series G1-L1 subcircuit.

A parallel G2-C2 subcircuit.

A parallel G3-C3 subcircuit.

One notes further that the three subcircuits are characterized by having very different time constants. The shortest time constant, $\tau_1 = L1 \cdot G1 = 93.5\ \mu S$, belongs to the series G1-L1 subcircuit. The next longest time constant, $\tau_2 = C2/G2 = 2.22$ mS, belongs to the parallel G2-C2 subcircuit; and the longest time-constant, $\tau_3 = C3/G3 = 41.6$ mS, belongs to the parallel G3-C3 subcircuit. Accordingly, the three subcircuits represent quite different physical processes and can be differentiated from one another by their time constants.

Figure 3:
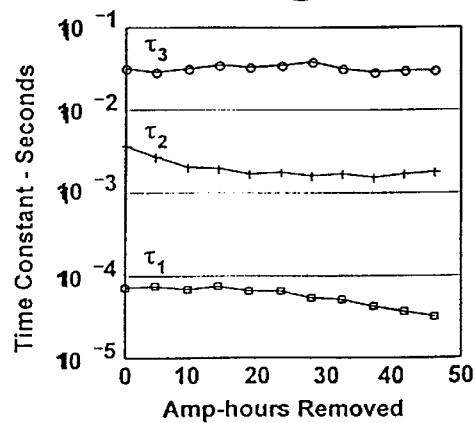
FIG. 3 is a plot of the variation of the three subcircuit time-constants defined in FIG. 2 as functions of the charge removed from the battery.

FIG. 3 is a logarithmic plot of the three time constants defined above as functions of charge (ampere-hours) removed from the battery. One notes that the three time constants remain widely separated as charge is removed, and that the longest of the three, $\tau_3$, is nearly independent of state-of-charge. This result is important to the present invention.

Figure 4:
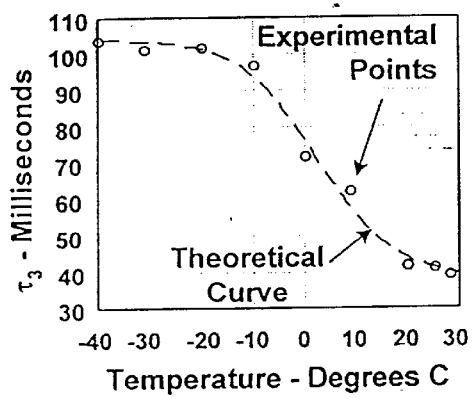
FIG. 4 is a plot of measured and theoretical values of time constant $\tau_3$ defined in FIG. 2 as functions of the internal temperature of the battery.

FIG. 4 discloses the observed variation of time constant $\tau_3 = C3/G3$ with internal battery temperature. One sees that $\tau_3$ varies inversely with temperature. This variation is consistent with a theoretical model that associates the G3-C3 subcircuit with a linearized, small-signal, representation of the nonlinear electrochemical reaction occurring at the negative plates. For such a model, the RC product $\tau_3 = C3/G3$ represents the reaction time for the process and therefore varies inversely with temperature. By empirically establishing this relationship between $\tau_3$ and T, one can actually utilize measurements of $\tau_3$ to determine the battery's internal temperature, T.

FIG. 4 shows experimental points compared with a theoretical $\tau_3(T_c)$ relationship. Note that the steepest slope, and hence the most accurate temperature determination, occurs in the most interesting region between $-20°$ C. and $+20°$ C. The theoretical curve disclosed in FIG. 4 is a plot of the following equation:

$$\tau_3(T_c) = K_3 + \cfrac{1}{\cfrac{1}{K_2} + \cfrac{1}{K_1 \exp\{qV_0/k(T_c+273°)\}}} \quad (1)$$

where $\tau_3$ is the time constant measured in milliseconds and $T_c$ is the internal temperature measured in degrees Celsius. Physical parameters introduced in this equation are:

k=1.38×10$^{-23}$ Joules/° K (Boltzman's Constant)

q=1.6×10$^{-19}$ Coulombs (electronic charge)

$V_0$=0.85 eV (activation energy)

The three constants $K_1$, $K_2$, and $K_3$ were empirically determined to be $K_1$=2.0×10$^{-14}$ $K_2$=67.0 mS $K_3$=37.0 mS One notes excellent agreement between theory and experiment. Measurements show that $\tau_3$ is virtually independent of battery size and state-of-charge (see FIG. 3). Thus, this empirical $\tau_3(T_c)$ relationship plotted in FIG. 4 appears to be quite universal.

In order to determine internal temperature from time constant measurements, one must mathematically invert the above $\tau_3(T_c)$ relationship to obtain a $T_c(\tau_3)$ relationship. The result is:

$$T_c(\tau_3) = \frac{(qV_0/k)}{\ln\left\{\frac{(K_2/K_1)(\tau_3 - K_3)}{(K_2 + K_3 - \tau_3)}\right\}} - 273° \quad (2)$$

where the parameters and constants, q, $V_0$, k, $K_1$, $K_2$, $K_3$, are the same as those introduced in the $\tau_3(T_c)$ relationship.

Figure 5:
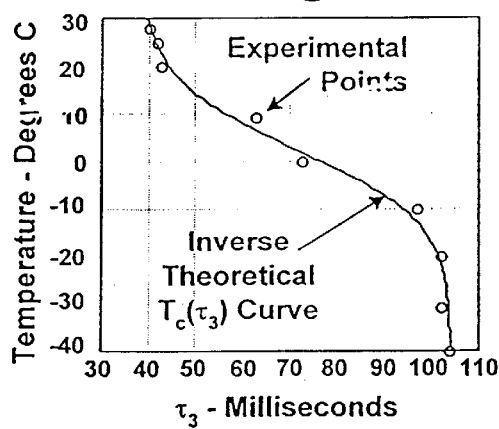
FIG. 5 is a plot of the inverse of the relationship plotted in FIG. 4.

The inverse theoretical $T_c(\tau_3)$ curve is plotted in FIG. 5. By employing this relationship, one can readily determine the battery's true internal temperature from measurements of $\tau_3$. This important temperature information can then be used to apply accurate temperature corrections to other measured quantities, such as CCA, state-of-charge, and amp-hour capacity. It can also be used to detect a thermal runaway condition, and to control an external process such as a battery charger.

Figure 6:
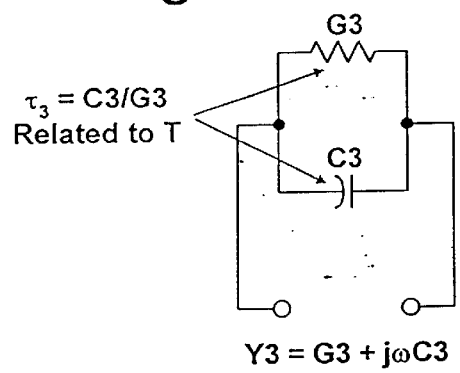
FIG. 6 is a circuit representation of the parallel G3-C3 subcircuit showing its admittance Y3.

This completes the disclosure of my invention. FIG. 6, however, will place the true nature of the invention in greater perspective. FIG. 6 illustrates the G3-C3 subcircuit and shows that the complex admittance of this parallel subcircuit, $Y3 = G3 + j\omega C3$, explicitly contains the two quantities, G3 and C3, necessary to determine the battery's internal temperature. Thus, my discussion above actually discloses a relationship existing between the real and imaginary parts of Y3 and the internal temperature of the battery. Although it is true that complex Z and complex Y are reciprocals of one another, no simple relationship exists between the real and imaginary parts of impedance Z3 and time constant $\tau_3$. Accordingly, the results of any ac measurement must be expressed in complex admittance form—not complex impedance form—in order to observe the important relationship that I have disclosed herein. How this complex admittance is obtained, however, is relatively unimportant.

Although my disclosure has relied upon particular apparatus and algorithms previously disclosed in U.S. patent applications Ser. No. 09/152,219 and Ser. No. 09/151,324, other methods will be apparent to one skilled in the arts. For example, one can employ bridges or other types of apparatus to measure complex admittance (or its reciprocal, complex impedance). Furthermore, if accuracy is not a strict requirement, one can take advantage of the fact that the various time constants are widely separated from one another and simply assume that the subcircuits are not coupled. Within this approximation, C2 and C3 are treated as short circuits at frequencies near $f_{01} = \frac{1}{2} \pi \tau_2$, L1 and C3 are treated as short circuits at frequencies near $f_{02} = \frac{1}{2} \pi \tau_1$, and at frequencies near $f_{03} = \frac{1}{2} \pi \tau_3$, L1 is treated as a short circuit while C2 is treated as an open circuit. Thus, with some batteries, it is possible to obtain satisfactory results from a very simple analysis of measurements at two or three frequencies. With certain batteries, it is even possible to obtain useful approximations to Y3 from measurements of complex Y or Z=1/Y obtained at a single, appropriately chosen, frequency. Workers skilled in the art will recognize that these and other variations may be made in form, and detail without departing from the true spirit and scope of my invention.

What is claimed is:

1. Apparatus for determining the internal temperature of an electrochemical cell or battery comprising:

electrical excitation circuitry adapted to apply multiple frequency electrical excitation to said cell or battery;

electrical response sensing circuitry configured to sense an electrical response of said cell or battery to said multiple frequency electrical excitation; and computation circuitry responsive to said multiple frequency electrical excitation and to said electrical response and adapted to evaluate said internal temperature from computations performed in accordance with said multiple frequency electrical excitation and said electrical response.

2. The apparatus of claim 1 including a display device coupled to said computation circuitry for conveying a computed value of said internal temperature to a user.

3. The apparatus of claim 1 wherein said computation circuitry couples to an external process device and said external process device is controlled by said computation circuitry in accordance with a computed value of said internal temperature.

4. The apparatus of claim 1 used to detect a thermal runaway condition, said condition characterized by a rapid rise in said internal temperature while charging said electrochemical cell or battery.

5. The apparatus of claim 4 including an alarm coupled to said computation circuitry for alerting a user to said thermal runaway condition.

6. The apparatus of claim 3 wherein said external process device is a battery charger.

7. Apparatus as in claim 1 wherein said multiple frequency electrical excitation is multiple frequency electrical current excitation and said electrical response is electrical voltage response.

8. The apparatus of claim 1 wherein said computation circuitry is further adapted to implement a temperature correction of a measured result in accordance with said internal temperature.

9. The apparatus of claim 8 wherein said measured result is measured dynamic conductance.

10. The apparatus of claim 8 wherein said measured result is a load-test result.

11. The apparatus of claim 8 wherein said measured result is expressed as CCA.

12. The apparatus of claim 8 wherein said measured result is expressed as state-of-charge.

13. The apparatus of claim 8 wherein said measured result is expressed as amp-hour capacity.

14. A method for electronically evaluating the internal temperature of an electrochemical cell or battery comprising the steps of:

applying multiple frequency electrical excitation to said cell or battery;

sensing an electrical response to said multiple frequency electrical excitation;

combining values of said multiple frequency electrical excitation and said electrical response mathematically to obtain a computed result; and evaluating said internal temperature from said computed result.

15. The method of claim 14 including the additional step of displaying said internal temperature to a user.

16. The method of claim 14 including the additional step of controlling an external process device in accordance with said internal temperature.

17. The method of claim 14 wherein said multiple frequency electrical excitation is multiple frequency electrical current excitation and said electrical response is electrical voltage response.

18. The method of claim 14 including the additional step of implementing a temperature correction of a measured quantity in accordance with said internal temperature.

19. The method of claim 18 wherein said measured quantity is dynamic conductance.

20. The method of claim 18 wherein said measured quantity is a load-test quantity.

21. The method of claim 18 wherein said measured quantity is expressed as CCA.

22. The method of claim 18 wherein said measured quantity is expressed as state-of-charge.

23. The method of claim 18 wherein said measured quantity is expressed as amp-hour capacity.

24. A method for implementing a temperature correction of a measured property of an electrochemical cell or battery comprising the steps of:

applying multiple frequency electrical excitation to said cell or battery;

sensing an electrical response to said multiple frequency electrical excitation;

combining values of said multiple frequency electrical excitation and said electrical response mathematically to compute a temperature correction factor; and adjusting the value of said measured property in accordance with said computed temperature correction factor.

25. The method of claim 24 wherein said measured property is measured dynamic conductance.

26. The method of claim 24 wherein said measured property is a measured load-test property.

27. The method of claim 24 wherein said measured property is expressed as CCA.

28. The method of claim 24 wherein said measured property is expressed as state-of-charge.

29. The method of claim 24 wherein said measured property is expressed as amp-hour capacity.

30. The method of claim 24 wherein said multiple frequency electrical excitation is multiple frequency electrical current excitation and said electrical response is electrical voltage response.

31. A method for detecting thermal runaway of an electrochemical cell or battery undergoing charging comprising the steps of:

applying multiple frequency electrical excitation to said cell or battery;

sensing an electrical response to said multiple frequency electrical excitation;

determining the internal temperature of said cell or battery from values of said multiple frequency electrical excitation and said electrical response; and responding to an abnormal increase in said internal temperature between successive internal temperature determinations.

32. The method of claim 31 wherein said step of responding includes activating an alarm signifying the detection of thermal runaway.

33. The method of claim 31 wherein said step of responding includes changing the output level of a battery charger.

34. The method of claim 31 wherein said multiple frequency electrical excitation is multiple frequency electrical current excitation and said electrical response is electrical voltage response.

35. Apparatus for electronically evaluating the internal temperature of an electrochemical cell or battery adapted for performing the steps according to claim 14.

36. Apparatus for implementing a temperature correction of a measured property of an electrochemical cell or battery adapted for performing the steps according to claim 24.

37. Apparatus for detecting thermal runaway of an electrochemical cell or battery undergoing charging adapted for performing the steps according to claim 31.

* * * * *

UNITED STATES PATENT AND TRADEMARK OFFICE
CERTIFICATE OF CORRECTION

PATENT NO. : 6,294,897 B1
DATED : September 25, 2001
INVENTOR(S) : Keith S. Champlin It is certified that error appears in the above-identified patent and that said Letters Patent is hereby corrected as shown below:

<u>Title page,</u>
Item [56], Reference Cited, change "Heafey et al." to -- Heavey et al. --.
Under OTHER PUBLICATIONS, change "JIS Japanese Industrial Standard-Lead Acid Batteries for Automobiles", Japanese Standarads Association UDC, 621.355.2:629.113.006, Nov. 1995". To -- JIS Japanese Industrial Standard-Lead Acid Batteries for Automobiles", Japanese Standards Association UDC, 621.355.2:629.113.006, Nov. 1995. --

Signed and Sealed this

Twentieth Day of August, 2002

Attest:

JAMES E. ROGAN
Attesting Officer   Director of the United States Patent and Trademark Office